United States Patent
Park et al.

(10) Patent No.: US 6,873,100 B2
(45) Date of Patent: Mar. 29, 2005

(54) ORGANIC ELECTRO LUMINESCENT DISPLAY DEVICE AND METHOD OF FABRICATING THE SAME

(75) Inventors: Jae-Yong Park, Gyeonggi-do (KR); Choong-Keun Yoo, Incheon (KR); Ock-Hee Kim, Gyeonggi-do (KR); Nam-Yang Lee, Gyeonggi-do (KR); Kwan-Soo Kim, Gyeonggi-do (KR)

(73) Assignee: LG. Philips LCD Co., Ltd., Seoul (KR)

( * ) Notice: Subject to any disclaimer, the term of this patent is extended or adjusted under 35 U.S.C. 154(b) by 109 days.

(21) Appl. No.: 10/329,540

(22) Filed: Dec. 27, 2002

(65) Prior Publication Data
US 2003/0205970 A1 Nov. 6, 2003

(30) Foreign Application Priority Data
May 3, 2002 (KR) .................. 10-2002-0024549

(51) Int. Cl.[7] .................................................. H05B 33/00
(52) U.S. Cl. .................. 313/506; 313/504; 445/23; 427/66
(58) Field of Search .................. 313/498, 504–506, 313/169.3; 345/45, 76; 428/917; 445/23–25; 427/58, 66

(56) References Cited

U.S. PATENT DOCUMENTS 6,215,244 B1 * 4/2001 Kuribayashi et al. ....... 313/505
6,429,584 B2 * 8/2002 Kubota ..................... 313/504
6,559,594 B2 * 5/2003 Fukunaga et al. .......... 313/506
6,618,029 B1 * 9/2003 Ozawa ....................... 345/82
6,626,721 B1 * 9/2003 Van Slyke .................. 445/24
2001/0026125 A1 * 10/2001 Yamazaki et al. .......... 313/505
2002/0093285 A1 * 7/2002 Sugimoto et al. .......... 313/506

FOREIGN PATENT DOCUMENTS

WO     WO 01/62051     8/2001

* cited by examiner

Primary Examiner—Ashok Patel
(74) Attorney, Agent, or Firm—Morgan Lewis & Bockius LLP

(57) ABSTRACT

An organic electroluminescent display (ELD) device includes a first substrate, a second substrate spaced apart and facing the first substrate, a plurality of switching elements and a plurality of driving elements interconnected on the first substrate, a plurality of connecting electrodes connected to each of the driving elements, a plurality of subsidiary electrodes formed on an inner surface of the second substrate in spaces between two adjacent pixel regions, a first electrode formed on the inner surface of the second substrate covering each of the subsidiary electrodes, an organic light-emitting layer disposed on the first electrode, and a second electrode having first portions disposed on the organic light-emitting layer.

35 Claims, 13 Drawing Sheets

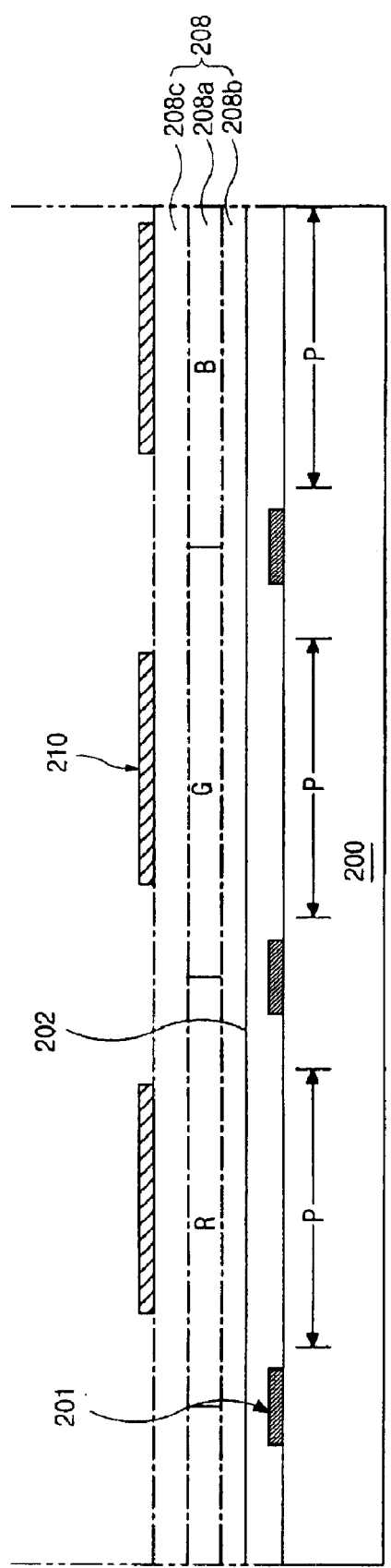

ORGANIC ELECTRO LUMINESCENT DISPLAY DEVICE AND METHOD OF FABRICATING THE SAME

The present invention claims the benefit of Korean Patent Application No. 2002-24549, filed in Korea on May 3, 2002 in Korea, which is hereby incorporated by reference.

BACKGROUND OF THE INVENTION

1. Field of the Invention

The present invention relates to a flat panel display device and more particularly, to an electroluminescent display (ELD) device and method of fabricating the same.

2. Discussion of the Related Art

Generally, organic electroluminescent display (ELD) devices have electron-input electrodes that are commonly referred to as cathode electrodes and hole-input electrodes that are commonly referred to as anode electrodes. The electrons and the holes are input into an light-emitting layer from the cathode and anode electrodes, respectively, wherein the electron and hole together form an exciton. The organic electroluminescent display (ELD) device emits light when the exciton is reduced from an excited state level to a ground state level. Accordingly, since organic electroluminescent display (ELD) devices do not require additional light sources, both volume and weight of the organic electroluminescent display (ELD) devices may be reduced. In addition, the organic electroluminescent display (ELD) devices are advantageous because of their low power consumption, high luminance, fast response time, and low weight. Presently, the organic electro luminescent display (ELD) devices are commonly implemented in mobile telecommunication terminals, car navigation systems (CNSs), personal digital assistants (PDAs), camcorders, and palm computers. In addition, since manufacturing processes for the organic electroluminescent display (ELD) devices are simple, manufacturing costs can be reduced as compared to liquid crystal display (LCD) devices. The organic electroluminescent display (ELD) devices may be classified into passive matrix-type and active matrix-type. Though the passive matrix-type organic electroluminescent display (ELD) devices have simple structures and manufacturing processes are simple, they require high power consumption and are not suitable for large-sized display devices. In addition, aperture ratios decrease as the number of electro lines increase. On the other hand, the active matrix-type organic electro luminescent display (ELD) devices have high light-emitting efficiency and high image display quality.

FIG. 1 is cross sectional view of an organic electroluminescent display (ELD) device according to the related art. In FIG. 1, the organic electro luminescent display (ELD) device 10 has a transparent first substrate 12, a thin film transistor array part 14, a first electrode 16, an organic light-emitting layer 18, and a second electrode 20, wherein the thin film transistor array part 14 is formed on the transparent first substrate 12. The first electrode 16, organic light-emitting layer 18, and second electrode 20 are formed over the thin film transistor array part 14. The light-emitting layer 18 displays red (R), green (G), and blue (B) colored light, and it is commonly formed by patterning organic material separately for each pixel for the R (red), G (green) and B (blue) colored light. A second substrate 28 has a moisture absorbent desiccant 22. The organic electroluminescent display (ELD) device 10 is completed by bonding the first and second substrates 12 and 28 together by disposing a sealant 26 between the first and second substrates 12 and 28. The moisture absorbent desiccant 22 removes moisture and oxygen that may be infiltrated into an interior of the organic electroluminescent display (ELD) device 10. The moisture absorbent desiccant 22 is formed by etching away a portion of the second substrate 28, filling the etched portion of the second substrate 28 with moisture absorbent desiccant material, and fixing the moisture absorbent desiccant material with tape 25.

FIG. 2 is a plan view of a thin film transistor array pixel part of an organic electroluminescent display (ELD) device according to the related art. In FIG. 3, the pixel includes a switching element $T_S$, a driving element $T_D$, and a storage capacitor $C_{ST}$ at every pixel region "P" defined on a substrate 12. The switching element $T_S$ and the driving element $T_D$ may be formed with combinations of more than two thin film transistors. The substrate 12 is formed of a transparent material, such as glass and plastic. A gate line 32 is formed along a first direction, and a data line 34 is formed along a second direction perpendicular to the first direction. The data line 34 crosses the gate line perpendicularly with an insulating layer between the gate and data lines 32 and 34. A power line 35 is formed along the second direction, and is spaced apart from the data line 34. The thin film transistor used for the switching element $T_S$ has a gate electrode 36, an active layer 40, a source electrode 46, and a drain electrode 50, and the thin film transistor for the driving element $T_D$ has a gate electrode 38, an active layer 42, a source electrode 48, and a drain electrode 52. The gate electrode 36 of the switching element $T_S$ is electrically connected to the gate line 32, and the source electrode 46 of the switching element $T_S$ is electrically connected to the data line 34. The drain electrode 50 of the switching element $T_S$ is electrically connected to the gate electrode 38 of the driving element $T_D$ through a contact hole 54, and the source electrode 48 of the driving element $T_D$ is electrically connected to the power line 35 through a contact hole 56. The drain electrode 52 of the driving element $T_D$ is electrically connected to a first electrode 16 within the pixel region "P," wherein the power line 35 and a first capacitor electrode 15 that is formed of polycrystalline silicon layer form a storage capacitor $C_{ST}$.

FIG. 3 is a cross sectional view along III—III of FIG. 2 according to the related art. In FIG. 3, only cross sectional views of the driving element and the light-emitting part are illustrated. As shown in FIG. 3, the organic electro luminescent display (ELD) device has the driving element, i.e., a thin film transistor $T_D$, a first electrode 16, a light-emitting layer 18, and a second electrode 20. The driving thin film transistor $T_D$ has a gate electrode 38, an active layer 42, a source electrode 56, and a drain electrode 52. The first electrode 16 is formed over the driving thin film transistor $T_D$ and is connected to the drain electrode 52 of the driving thin film transistor $T_D$ with an insulating layer between the first electrode 16 and the driving thin film transistor $T_D$. The light-emitting layer 18 is formed on the first electrode 16 for emitting light of a particular color wavelength, and the second electrode 20 is formed on the light-emitting layer 18. A storage capacitor $C_{ST}$ (in FIG. 2) is connected in parallel to the driving thin film transistor $T_D$, and includes first and second capacitor electrodes 35 and 15. The source electrode 56 of the driving thin film transistor $T_D$ contacts the second capacitor electrode 35, i.e., a power line, and the first capacitor electrode 15 is formed of polycrystalline silicon material under the second capacitor electrode 35. The second electrode 20 is formed on the substrate 12 on which the driving element $T_D$, the storage capacitor $C_{ST}$, and the organic light-emitting layer 18 are formed. Accordingly, the organic electroluminescent display (ELD) device is a bottom emission-type device, wherein the light-emitting layer emits the light downward of the substrate.

The organic electroluminescent display (ELD) device is commonly manufactured by forming the thin film transistor array part and the light-emitting part on a same substrate, and then bonding the substrate to an encapsulating structure. If the thin film transistor array part and the light-emitting part are formed on the same substrate, then a yield of a panel having the thin film transistor array portion and the light-emitting part is dependent upon the product of the individual yields of the thin film transistor array part and the light-emitting part. However, the yield of the panel is greatly affected by the yield of the organic light-emitting layer. Accordingly, if an inferior organic light-emitting layer that is usually formed of a thin film having a thickness of 1000 Å has a defect due to impurities and contaminants, the panel is classified as a inferior panel. This leads to wasted production costs and material, thereby decreasing the yield of the panel.

The bottom emission-type organic electroluminescent display (ELD) devices are advantageous for their high image stability and variable fabrication processing. However, the bottom emission-type organic electroluminescent display (ELD) devices are not adequate for implementation in devices that require high resolution due to limitations of increased aperture ratio. In addition, since top emission-type organic electroluminescent display (ELD) devices emit light upward of the substrate, the light can be emitted without influencing the thin film transistor array part that is positioned under the light-emitting layer. Accordingly, design of the thin film transistor may be simplified. In addition, the aperture ratio can be increased, thereby increasing operational life span of the organic electroluminescent display (ELD) device. However, since a cathode is commonly formed over the light-emitting layer in the top emission-type organic electroluminescent display (ELD) devices, material selection and light transmittance are limited such that light transmission efficiency is lowered. If a thin film-type passivation layer is formed to prevent a reduction of the light transmittance, the thin film passivation layer may fail to prevent infiltration of exterior air into the device.

SUMMARY OF THE INVENTION

Accordingly, the present invention is directed to an organic electro luminescent display (ELD) device and manufacturing method for the same that substantially obviates one or more of problems due to limitations and disadvantages of the related art.

An object of the present invention is to provide an organic electroluminescent display (ELD) device in which a thin film transistor array part and a light-emitting part are independently formed on different substrates, wherein a plurality of subsidiary electrodes are formed within a light-emitting part to reduce electric resistance of a first electrode.

Another object of the present invention is to provide a method of fabricating an organic electroluminescent display (ELD) device in which a thin film transistor array part and a light-emitting part are independently formed on different substrates and a plurality of subsidiary electrodes are formed within a light-emitting part to reduce electric resistance of a first electrode.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic electroluminescent display (ELD) device includes a first substrate, a second substrate spaced apart and facing the first substrate, a plurality of switching elements and a plurality of driving elements interconnected on the first substrate, a plurality of connecting electrodes connected to each of the driving elements, a plurality of subsidiary electrodes formed on an inner surface of the second substrate in spaces between two adjacent pixel regions, a first electrode formed on the inner surface of the second substrate covering each of the subsidiary electrodes, an organic light-emitting layer disposed on the first electrode, and a second electrode having first portions disposed on the organic light-emitting layer.

In another aspect, a method of fabricating an organic electroluminescent display (ELD) device includes forming a plurality of switching elements and a plurality of driving elements interconnected on a first substrate, forming a plurality of connecting electrodes interconnected to each of the driving elements, forming a plurality of subsidiary electrodes within spaces between two adjacent pixel regions of a second substrate, forming a first electrode on an inner surface of the second substrate covering the plurality of subsidiary electrodes, forming an organic light-emitting layer on the first electrode, forming first portions of a second electrode on the organic light-emitting layer, and bonding the first and second substrates so that the connecting electrode of the first substrate contacts the second electrode.

In another aspect, an organic electroluminescent display (ELD) device includes a first substrate, a second substrate spaced apart and facing the first substrate, a plurality of switching elements and a plurality of driving elements interconnected on the first substrate, a plurality of connecting electrodes connected to each of the driving elements, a first electrode formed on an inner surface of the second substrate, a plurality of subsidiary electrodes formed on the first electrode within spaces between two adjacent pixel regions, a plurality of partitions having first end portions of a first width disposed on the subsidiary electrodes and the first electrode and second end portions of a second width larger than the first width, a plurality of organic light-emitting layers disposed on the first electrode between the plurality of partitions, and a second electrode disposed on the organic light-emitting layers and the second end portions of the plurality of partitions.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIGS. 7A to 7C are cross sectional views of an exemplary fabrication process of a light-emitting part of an organic electroluminescent display (ELD) device according to the present invention;

DETAILED DESCRIPTION OF THE ILLUSTRATED EMBODIMENTS

Reference will now be made in detail to the illustrated embodiment of the present invention, which is illustrated in the accompanying drawings.

Figure 1:
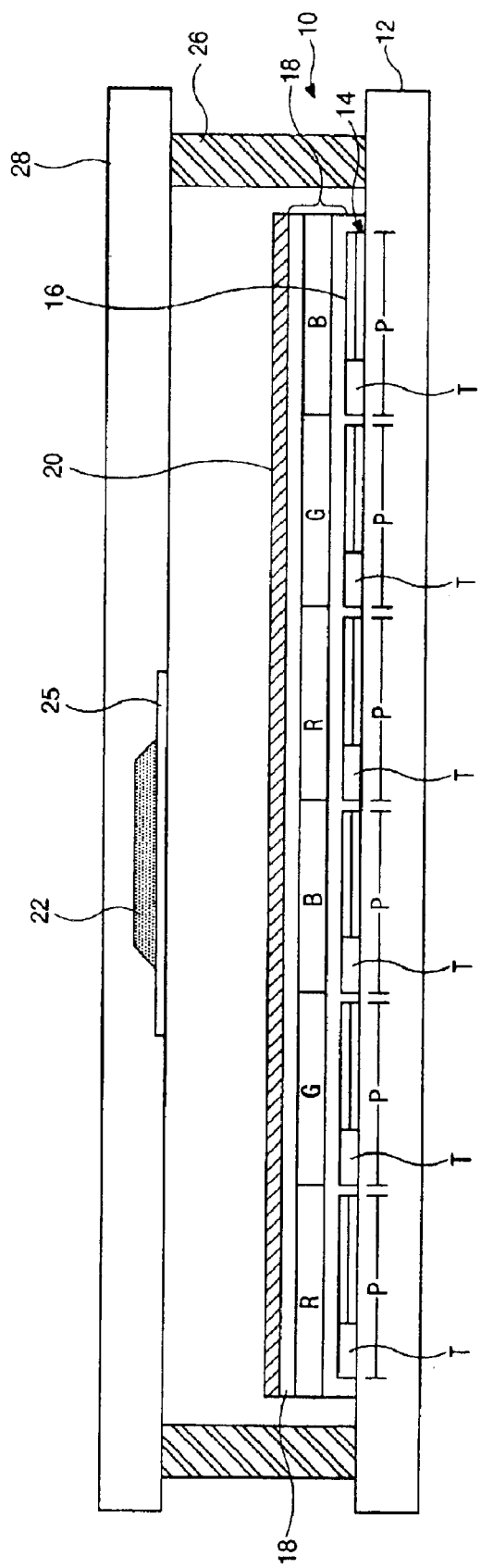
FIG. 1 is a cross sectional view of an organic electroluminescent display (ELD) device according to the related art.
Figure 2:
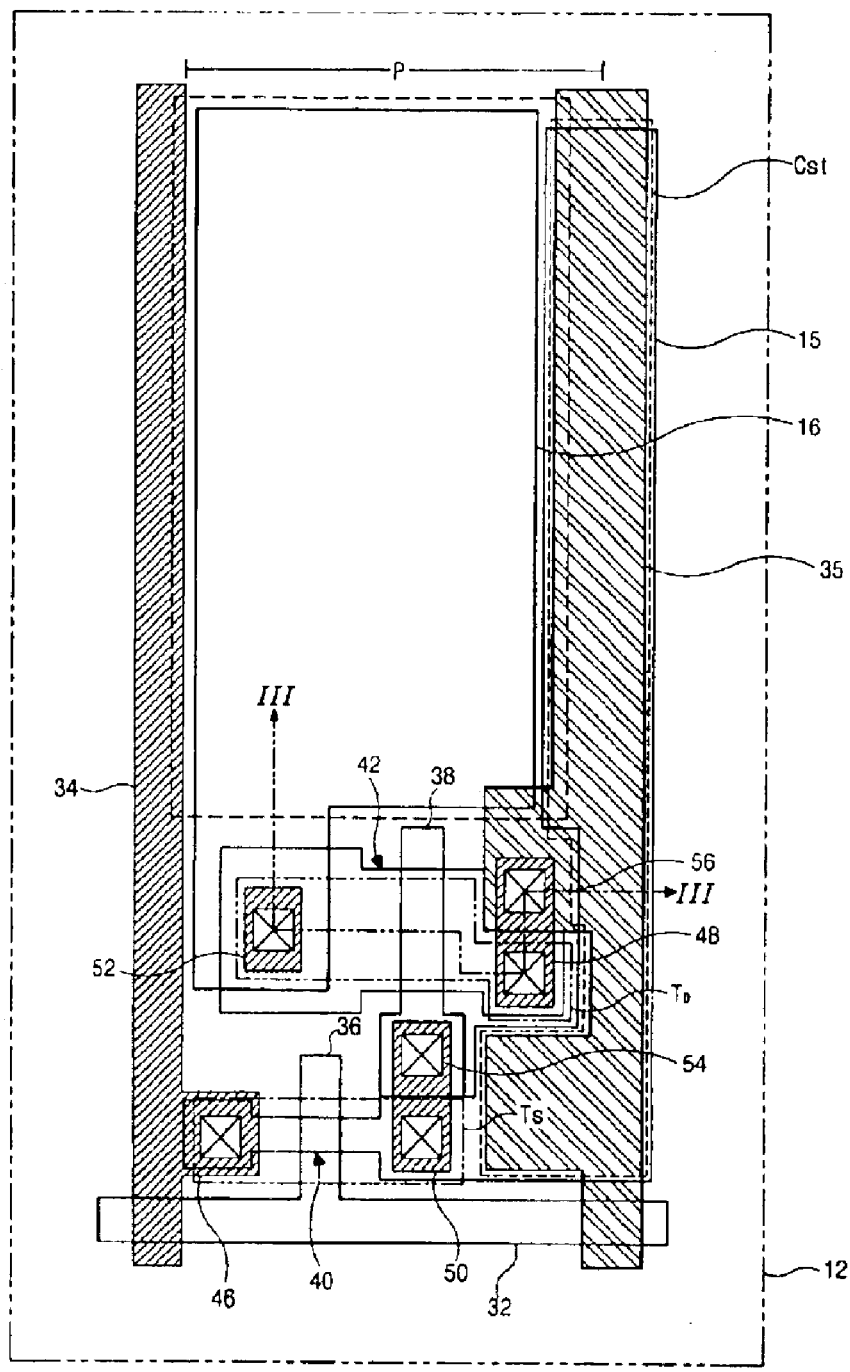
FIG. 2 is a plan view of a thin film transistor array pixel part of an organic electroluminescent display (ELD) device according to the related art.
Figure 3:
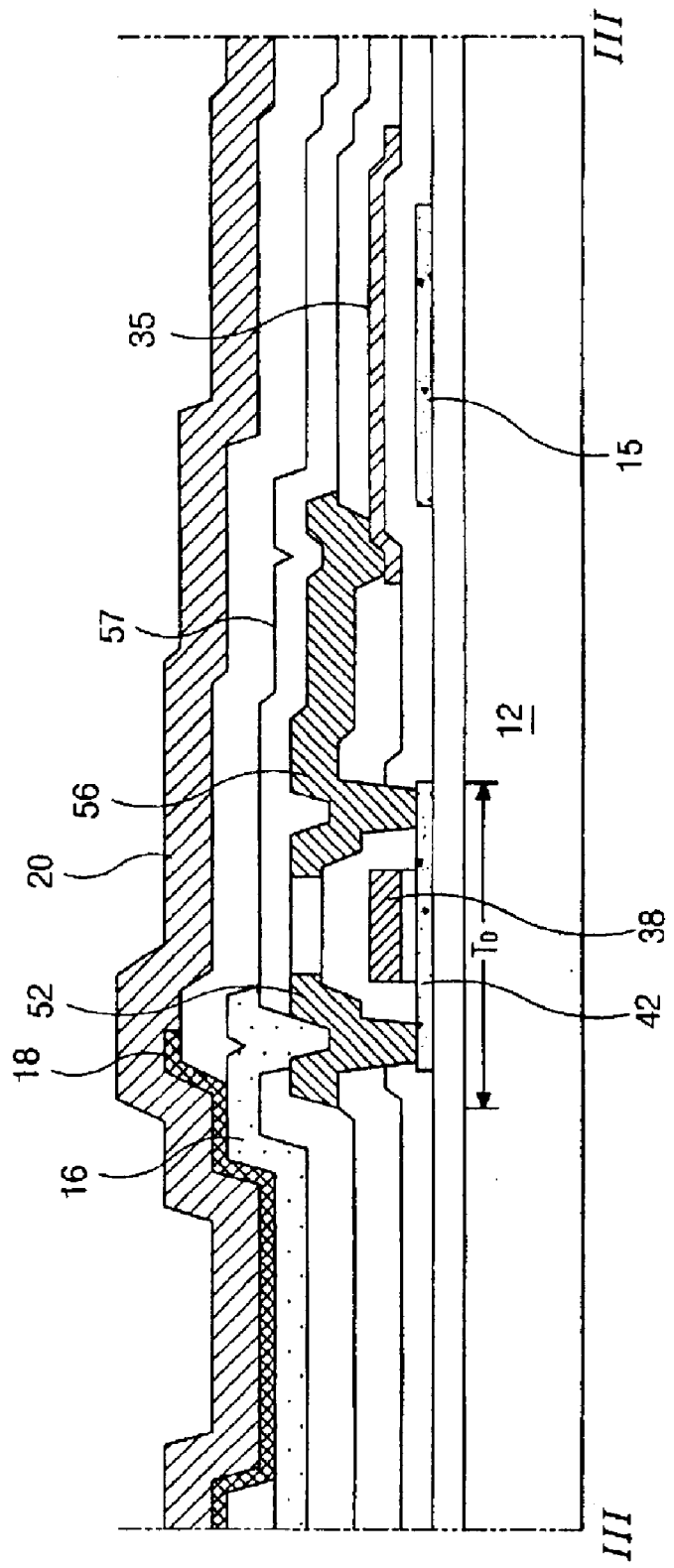
FIG. 3 is a cross sectional view along III—III of FIG. 2 according to the related art.
Figure 4:
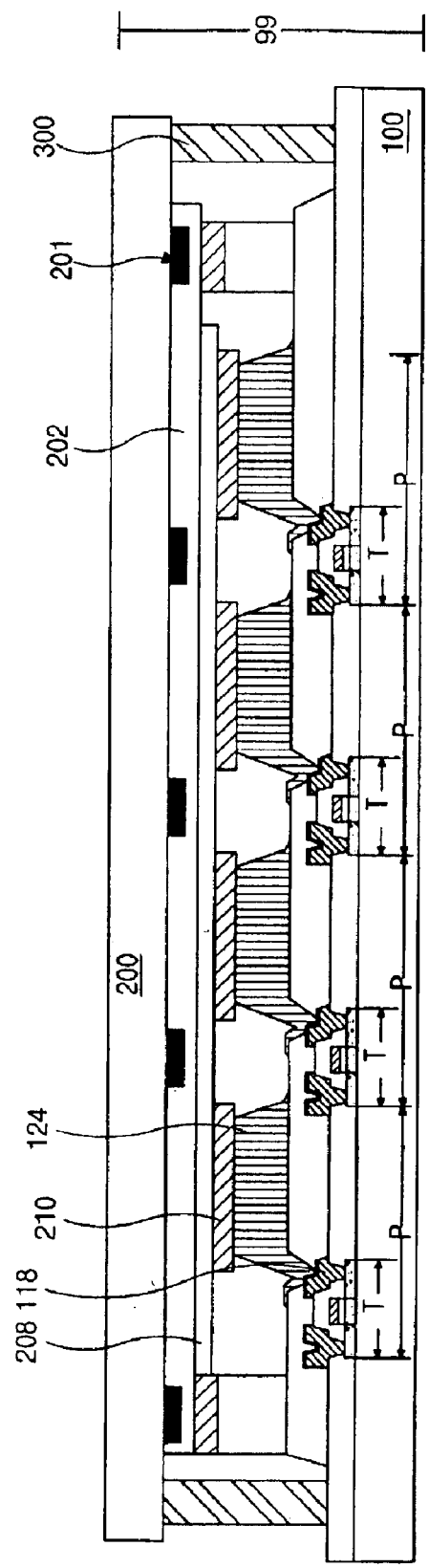
FIG. 4 is a cross sectional view of an exemplary organic electroluminescent display (ELD) device according to the present invention.

FIG. 4 is a cross sectional view of an exemplary organic electroluminescent display (ELD) device according to the present invention. In FIG. 4, a organic electro luminescent display (ELD) device 99 may include transparent first and second substrates 100 and 200 bonded together with a sealant 300. A plurality of pixel regions "P" may be defined on the first substrate 100, and a thin film transistor "T" functioning as a switching element and a driving element may be formed at each of the pixel regions "P." In addition, although not shown, the first substrate 100 may include array lines. A plurality of subsidiary electrodes 201 may be formed on the second substrate 200, and a transparent first electrode 202 (an anode) may be formed on an entire surface of the second substrate 200 upon which the subsidiary electrodes 201 are already formed. An organic light-emitting layer 208 and a second electrode 210 (cathode electrode) may be sequentially formed over the first electrode 202. The second electrode 210 and a drain electrode 118 of the driving thin film transistor may be indirectly connected through an additional connecting electrode 124. Accordingly, if the connecting electrode 124 is formed on the first substrate 100 and the first and second substrate 100 and 200 are bonded together, then the connected electrode 124 on the first substrate 100 contacts the second electrode 210 on the second substrate 200. The subsidiary electrodes 201 may be formed in non-pixel regions between a pixel region "P" and an adjacent pixel region "P," thereby improving an aperture ratio. The pixel regions "P" may form a matrix and the subsidiary electrodes 201 may form a lattice shape.

Figure 5:
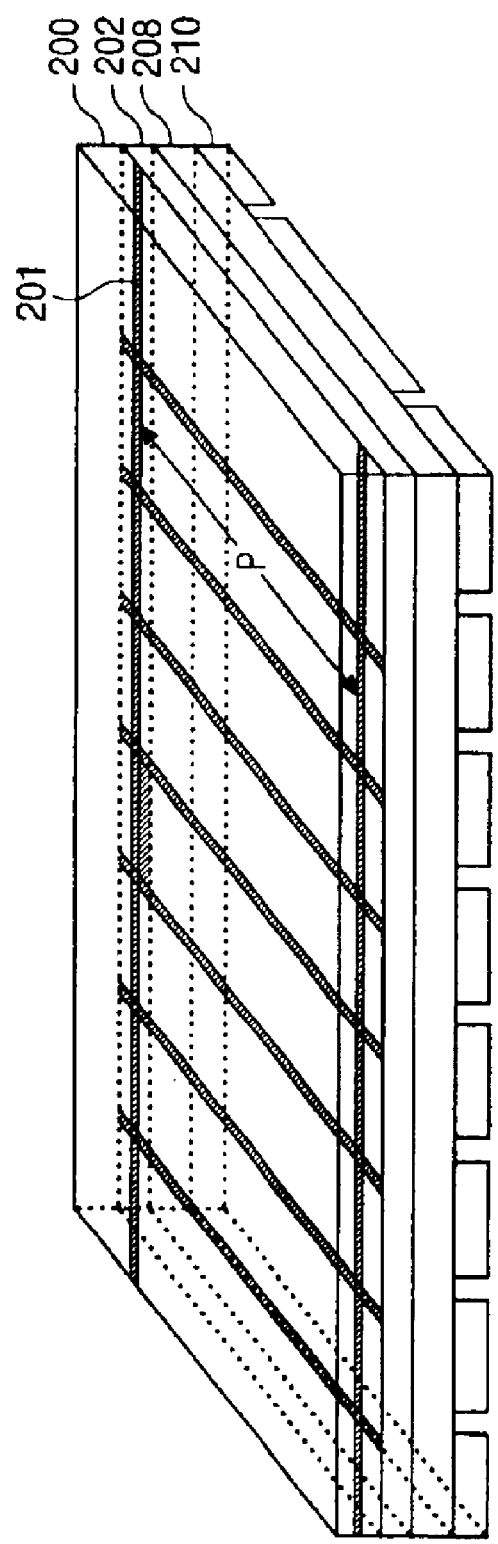
FIG. 5 is a perspective view of an exemplary light-emitting portion of an organic electroluminescent display (ELD) device according to the present invention.

FIG. 5 is a perspective view of an exemplary light-emitting portion of an organic electroluminescent display (ELD) device according to the present invention. In FIG. 5, subsidiary electrodes 201 having a low resistance may be formed on a transparent second substrate 200, and a transparent first electrode 202 (anode) may be formed on the subsidiary electrodes 201. A light-emitting layer 208 and a second electrode 210 (cathode) may be sequentially formed over the transparent first electrode 202 such that the second electrode 210 may be independently formed for each of pixel regions "P." The light-emitting layer 208 may include a single layered structure or a multi-layered structure. If the light-emitting layer 208 includes the multi-layered structure, it may further include a hole-carrying layer (not shown) formed adjacent to the transparent first electrode 202 and an electron-carrying layer (not shown) formed adjacent to the second electrode 210. The transparent first electrode 202 may include indium tin oxide (ITO). Since the indium tin oxide (ITO) has a high resistance value, a signal delay value may increase as a size of the organic electroluminescent display (ELD) device increases. The subsidiary electrodes 201 function to lower electric resistance of the transparent first electrode 202, and may include conductive metal materials having an electrical resistance lower than the electrical resistance of the first electrode 202. For example, when the first electrode 202 includes indium tin oxide (ITO), the subsidiary electrode 201 may include one of aluminum (Al) and chromium (Cr).

Figure 6A:
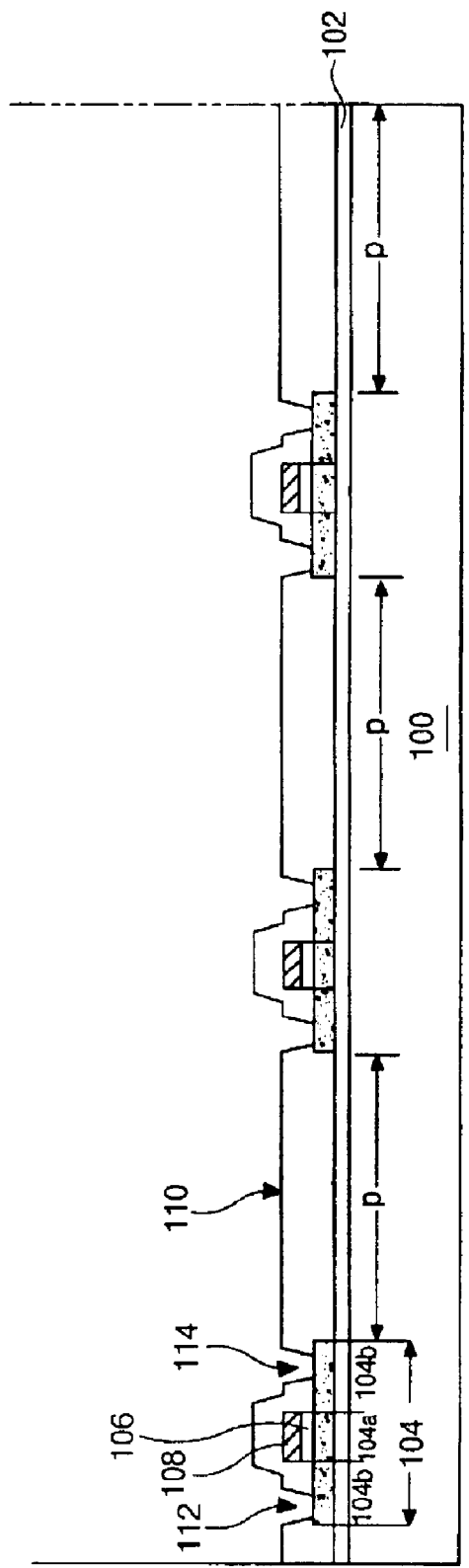
FIGS. 6A to 6C are cross sectional views of an exemplary fabrication process of a thin film transistor array of an organic electroluminescent display (ELD) device according to the present invention.
Figure 6B:
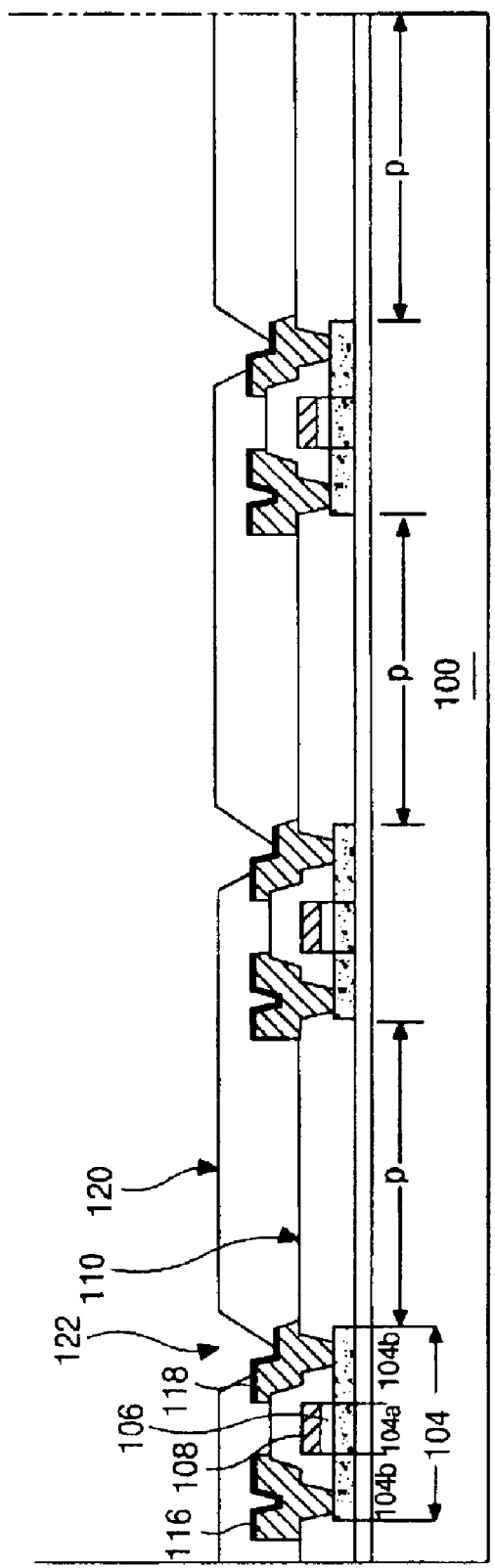
Figure 6C:
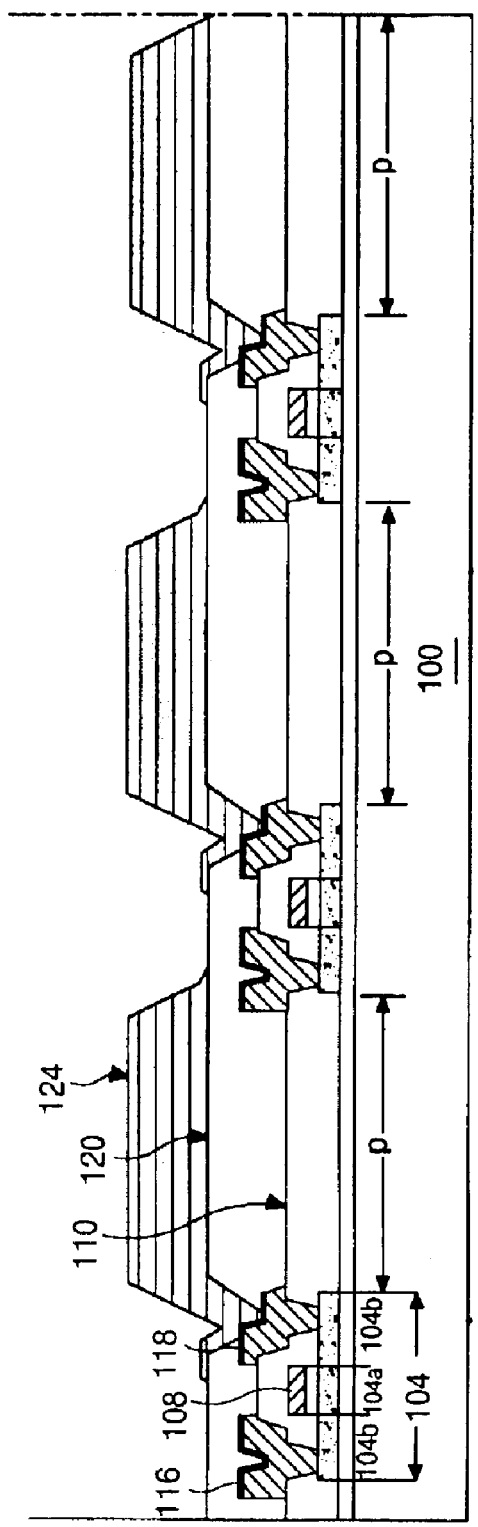

FIGS. 6A to 6C are cross sectional views of an exemplary fabrication process of a thin film transistor array of an organic electroluminescent display (ELD) device according to the present invention. In FIG. 6A, a buffer layer 102 may be formed by depositing an inorganic insulating material, such as silicon nitride (SiNx) and silicon oxide ($SiO_2$), on a substrate 100 upon which a plurality of pixel regions "P" are defined. An active layer 104 may be formed by depositing amorphous silicon (a-Si:H) on the buffer layer 102, dehydrogenating the deposited amorphous silicon (a-Si:H), crystallizing dehydrogenated silicon into polycrystalline silicon layer, and then patterning the polycrystalline silicon layer. In addition, the active layer 104 may include first and second active layers 104a and 104b. A gate insulating layer 106 may be formed by depositing an inorganic insulating material, such as silicon nitride (SiNx) and silicon oxide ($SiO_2$), onto an entire surface of the substrate 100. Alternatively, the gate insulating layer 106 may be etched into individual portions. A gate electrode 108 may be formed on the gate insulating layer 106 at positions corresponding to the first active layer 104a. The second active layer 104b may be converted into an ohmic contact layer by doping the second active layer 104b with impurities, such as boron group elements or phosphorus group elements. An interlayer 110 may be formed on entire surface of the substrate 100 upon which the gate electrode 108 is already formed, and first and second contact holes 112 and 114 that expose portions of the second active layer 104b may be formed by patterning the interlayer 110. The gate electrode 108 may include a conductive metal material, such as aluminum (Al), aluminum alloys, copper (Cu), tungsten (W), tantalum(Ta), and molybdenum (Mo). The interlayer 110 may include inorganic insulating materials, such as silicon nitride (SiNx) and silicon oxide ($SiO_2$).

In FIG. 6B, source and drain electrodes 116 and 118 may be formed to electrically contact the exposed portions of the second active layer 104b by depositing a second metal layer on the interlayer 110, and then patterning the second metal layer. A passivation layer 120 may be formed by depositing or coating inorganic insulating materials, such as silicon nitride (SiNx) and silicon oxide ($SiO_2$), or organic insulating materials, such as benzocyclobutene (BCB) and acrylic resin, on an entire surface of the substrate 100. A drain contact hole 122 may be formed to expose a portion of the drain electrode 118 of the driving thin film transistor by patterning the passivation layer 120.

In FIG. 6C, a connecting electrode 124 that electrically contacts the drain electrode 118 may be formed by depositing conductive metal materials on the passivation layer 120, and then patterning the conductive materials. Although not shown, a switching thin film transistor that is connected to the driving thin film transistor may be formed by a similar process as the process for forming the driving thin film transistor. Accordingly, a drain electrode of the switching thin film transistor may be electrically connected to the gate electrode 108 of the driving thin film transistor. In addition, a gate line (not shown) may be simultaneously formed with formation of the gate electrode of the switching thin film transistor, and a data line (not shown) may be simultaneously formed with formation of the source and drain electrodes of the switching thin film transistor.

Figure 7A:
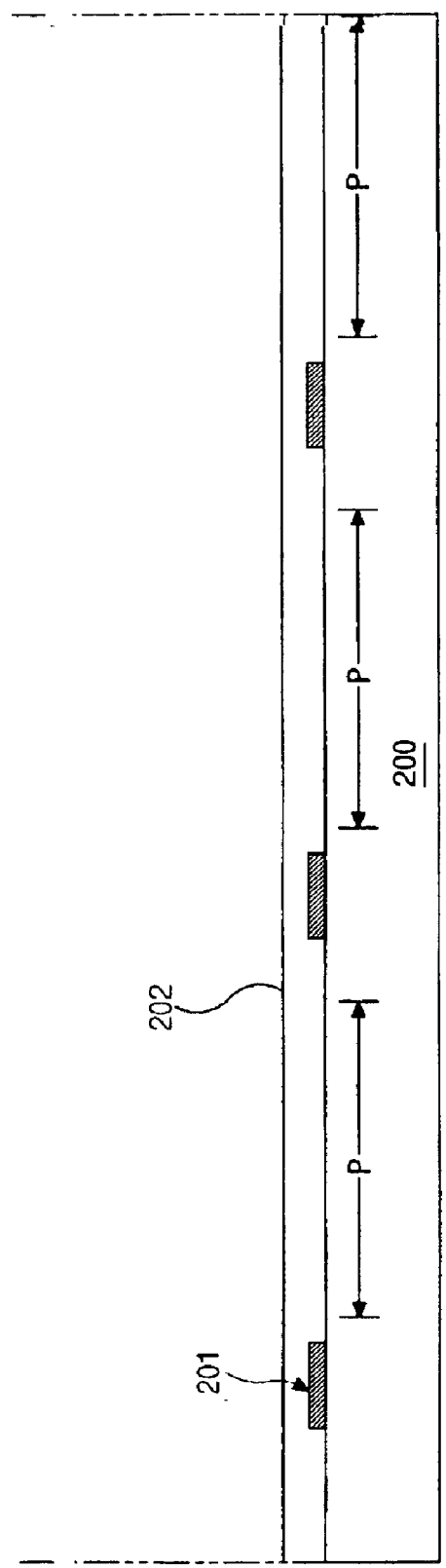
Figure 7B:
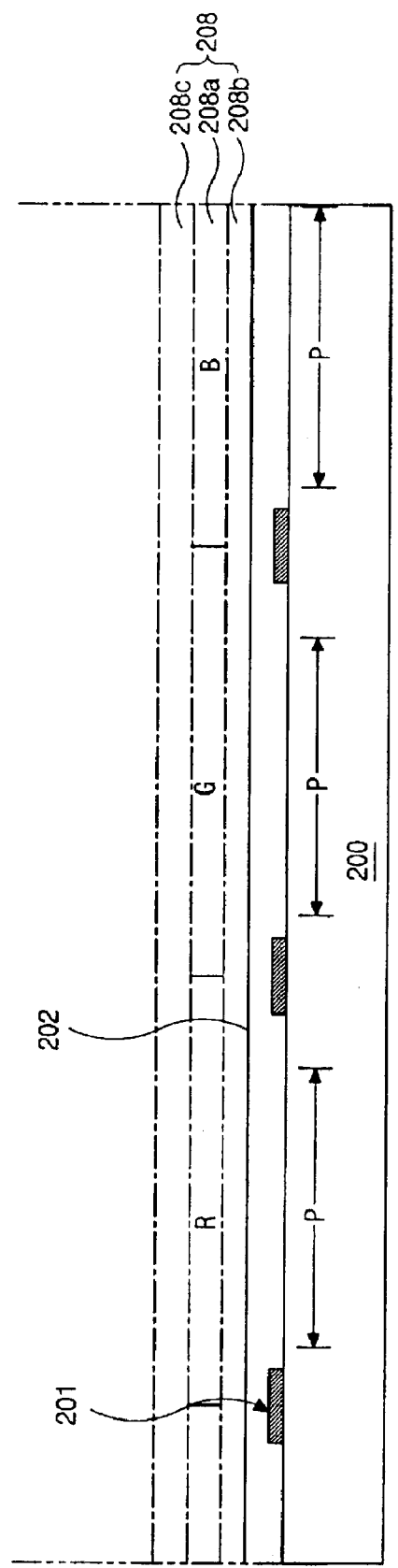

FIGS. 7A to 7C are cross sectional views of an exemplary fabrication process of a light-emitting part of an organic electroluminescent display (ELD) device according to the present invention. In FIG. 7A, a plurality of subsidiary electrodes 201 may be formed by depositing a low resistance metal material on a transparent second substrate 200, and then patterning the low resistance metal material. The metal material for the subsidiary electrode 201 may include metal materials that have lower electrical resistance than an electrical resistance of a first electrode 202. For example, if the first electrode 202 includes indium tin oxide (ITO), the subsidiary electrode 201 may include one of aluminum (Al), aluminum alloys (AlNd), chromium (Cr), and molybdenum (Mo). Since the subsidiary electrode 201 may include an opaque metal material, it may be formed in a region that corresponds to a non-pixel region. The first electrode 202 may be formed on an entire surface of the transparent second substrate 200 upon which the subsidiary electrodes 201 are formed. The first electrode 202 may function as an anode to input holes into an organic light-emitting layer 208 of FIG. 7B, and may include indium tin oxide (ITO) having a high work function.

In FIG. 7B, the organic light-emitting layer 208 may be divided into sections R, G, and B on the first electrode 202. Each of the sections R, G, and B of the organic light-emitting layer 208 corresponds to each of the pixel regions "P" to emit colored light of red, green, and blue. The organic light-emitting layer 208 may be formed as a single layer or as multiple layers. If the organic light-emitting layer 208 is formed to have multiple layers, then the organic light-emitting layer 208 may include a main light-emitting layer 208a, a hole carrying layer 208b, and an electron carrying layer 208c.

In FIG. 7C, a second electrode 210 may be formed on the organic light-emitting layer 208 to correspond to each of the pixel regions "P." The second electrode 210 may include aluminum (Al), calcium (Ca), and magnesium (Mg), or may include a double metal layer of lithium fluorine (LiF)/aluminum (Al), for example.

Accordingly, the organic electro-luminescent display (ELD) device of FIG. 4 may be manufactured by bonding the thin film transistor array part of FIGS. 6A–6C and the light-emitting part of FIGS. 7A–7C.

Figure 8:
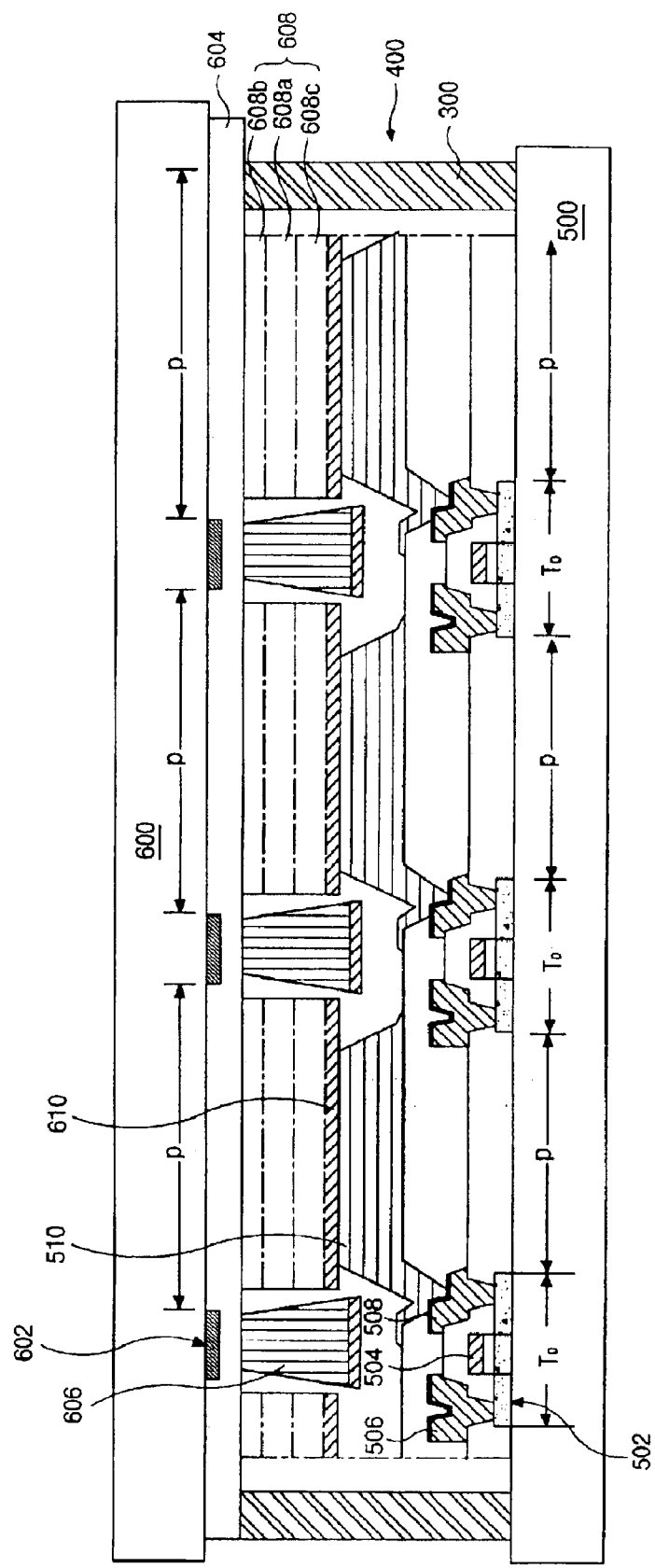
FIG. 8 is a cross sectional view of an exemplary organic electroluminescent display (ELD) device according to the present invention.

FIG. 8 is a cross sectional view of an exemplary organic electroluminescent display (ELD) device according to the present invention. In FIG. 8, first and second substrates 500 and 600 may be bonded together with a sealant 300 disposed between the first and second substrates 500 and 600, and a plurality of pixel regions "P" may be defined on the first and second substrates 500 and 600. Accordingly, the pixel regions "P" of the first substrate 500 corresponds to the pixel region "P" of the second substrate 600. In addition, a driving thin film transistor $T_D$ having an active layer 502, a gate electrode 504, a source electrode 506, and a drain electrode 508 may be formed on the first substrate 500, and a connecting electrode 510 may be further formed over the first substrate 500. A plurality of subsidiary electrodes 602 may be formed on the second substrate 600 to correspond to non-pixel regions between the pixel regions "P" and adjacent pixel regions "P." Since the pixel regions "P" may be formed in a matrix shape, the subsidiary electrodes 602 may form a lattice shape. A first electrode 604 may be formed on the subsidiary electrodes 602 to function as an anode to input holes into a light-emitting layer 608. In addition, the first electrode serves as a common electrode. The first electrode 604 may be formed on an entire surface of the second substrate 600, and may include indium tin oxide (ITO) that is transparent and has a high work function.

A plurality of partitions 606 may be formed on the first electrode 604, wherein each partition 606 corresponds to each subsidiary electrode 602. A sectional width of each of the partitions 606 may increase from a first electrode side and to a second electrode side. A light-emitting layer 608 may be formed on exposed portions of the first electrode 604 between the partitions 606. The light-emitting layer 608 may include a single layer structure or a multiple layer structure. If the light-emitting layer 608 includes the multiple layer structure, it may include a main light-emitting layer 608a, a hole carrying layer 608b, and an electron carrying layer 608c. The hole carrying layer 608b may electrically contact the first electrode 604, and the electron carrying layer 608c may electrically contact the second electrode 610. The second electrode 610 may be formed on the light-emitting layer 608 to be separately formed within each of the pixel regions "P." Accordingly, the partition 606 that is formed within the non-pixel region between two adjacent pixel regions "P" may divide the second electrode 610 so that the second electrode 610 includes a plurality of divided portions that correspond to each of the pixel regions "P."

Figure 9:
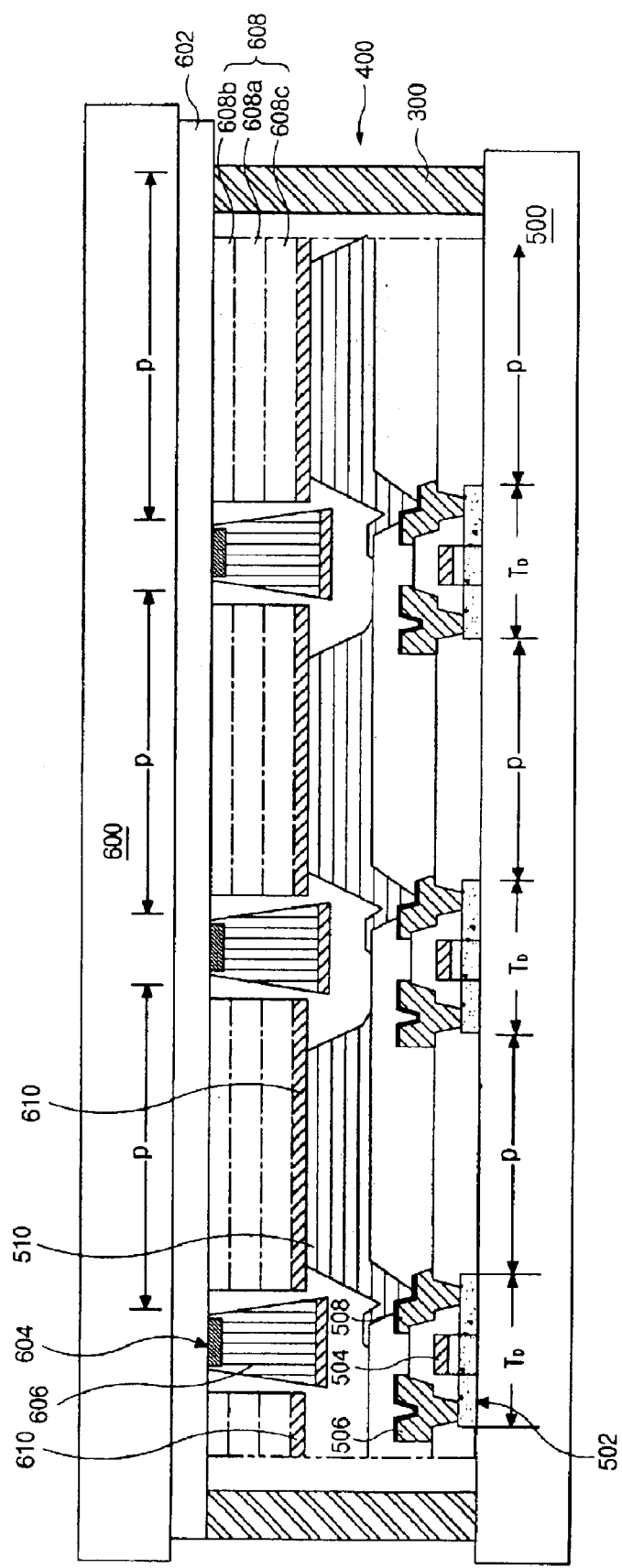
FIG. 9 is a cross sectional view of another organic electroluminescent display (ELD) device according to the present invention.

FIG. 9 is a cross sectional view of another organic electroluminescent display (ELD) device according to the present invention. In FIG. 9, the organic electro luminescent display (ELD) device 400 may include a first substrate 500 having a thin film transistor array part, and a second substrate 600 having a light-emitting part, wherein the first and second substrates 500 and 600 may be bonded together with sealant 300 disposed between the first and second substrates 500 and 600. The first and second substrates 500 and 600 each may have a plurality of corresponding pixel regions "P." The first substrate 500 may include a driving thin film transistor TD and a connecting electrode 510, wherein the driving thin film transistor TD may include an active layer 502, a gate electrode 504, a source electrode 506, and a drain electrode 508. The connecting electrode 510 may be electrically connected to the drain electrode 508 of the driving thin film transistor TD. A first electrode 602 may be formed on an inner surface of the second substrate 600, and a plurality of subsidiary electrodes 604 (anodes) may be formed on the first electrode 602. The subsidiary electrodes 604 may include indium tin oxide (ITO) having a high work function. A plurality of partitions 606 may be formed to have first end portions disposed on each of the subsidiary electrodes 604 as well as on the first electrode 602. In addition, a plurality of second electrodes 610 may be formed on a light emitting layer 608 and on second end portions of the plurality of partitions 606. Accordingly, each of the first end portions of the partitions 606 may laterally surround each of the subsidiary electrodes 604. In addition, each of the partitions 606 may have a trapezoidal shape, wherein the first end portion may have first width and the second end portion may have a second width larger than the first width. The light-emitting layer 608 may be formed on exposed portions of the first electrode 602 between two adjacent partitions 606. The light-emitting layer 608 may be formed having a single layer structure or as a multiple layer structure. If the light-emitting layer 608 is formed having a multiple layer structure, then the light-emitting layer 608 may include a triple-layered structure. For example, the light-emitting layer 608 may have a main light-emitting layer 608a, a hole carrying layer 608b, and an electron carrying layer 608c. The hole carrying layer 608b may electrically contact the first electrode 602, and the electron carrying layer 608c may contact the second electrode 610. In addition, the second electrode 610 may be separately formed within each of the pixel regions "P" that are divided by the partitions 606.

The organic electroluminescent display (ELD) device of the present invention has the following advantages. First, since the organic electroluminescent display (ELD) device is a top emission-type device, and a shape of an array pattern under the light-emitting layer is not affected by the emitting light, a high aperture ratio can be obtained. Second, since the organic light-emitting layer is not formed on a same substrate with the thin film transistor array pattern, the organic light-emitting layer can be formed independently without considering effects to the thin film transistor, thereby increasing manufacturing yield. Third, since the resistance of the first electrode can be reduced due to the subsidiary electrode, a large-sized organic electroluminescent display (ELD) device can be manufactured.

It will be apparent to those skilled in the art that various modifications and variations can be made in the organic electro luminescent display device and method of fabricating the same of the present invention without departing from the spirit or scope of the invention. Thus, it is intended that the present invention cover the modifications and variations of this invention provided they come within the scope of the appended claims and their equivalents.

What is claimed is:

1. An organic electroluminescent display (ELD) device, comprising:
   a first substrate;
   a second substrate spaced apart and facing the first substrate;
   a plurality of switching elements and a plurality of driving elements interconnected on the first substrate;
   a plurality of connecting electrodes connected to each of the driving elements;
   a plurality of subsidiary electrodes formed on an inner surface of the second substrate in spaces between two adjacent pixel regions;
   a first electrode formed on the inner surface of the second substrate covering each of the subsidiary electrodes;
   an organic light-emitting layer disposed on the first electrode; and
   a second electrode having first portions disposed on the organic light-emitting layer.

2. The device according to claim 1, wherein the subsidiary electrodes form a lattice shape.

3. The device according to claim 1, further comprising a plurality of partitions having first end portions of a first width and second end portions of a second width.

4. The device according to claim 3, wherein each of the first end portions are disposed on the first electrode in alignment with each of the subsidiary electrodes.

5. The device according to claim 3, wherein the second width is larger than the first width.

6. The device according to claim 5, wherein the second electrode includes second portions disposed on the second end portions of the partitions.

7. The device according to claim 6, wherein the second end portions are aligned with the driving elements.

8. The device according to claim 1, wherein the subsidiary electrode includes one of aluminum (Al), chromium (Cr), and molybdenum (Mo).

9. The device according to claim 8, wherein an electrical resistance of the subsidiary electrode is lower than an electrical resistance of the first electrode.

10. The device according to claim 1, wherein the first electrode functions as an anode electrode to input holes into the organic light-emitting layer, and the second electrode functions as a cathode electrode to input electrons into the organic light-emitting layer.

11. The device according to claim 10, wherein the first electrode includes indium-tin-oxide (ITO).

12. The device according to claim 10, wherein the second electrode includes one of calcium (Ca), aluminum (Al), and magnesium (Mg).

13. The device according to claim 1, wherein the connecting electrode includes one of calcium (Ca), aluminum (Al) and magnesium (Mg).

14. The device according to claim 1, wherein the organic light-emitting layer includes a hole-carrying layer adjacent to the first electrode and an electron-carrying layer adjacent to the first portions of the second electrode.

15. The device according to claim 1, wherein the subsidiary electrode includes a conductive metal material having an electrical resistance lower than an electrical resistance of the first electrode.

16. The device according to claim 1, wherein the subsidiary electrode includes one of aluminum (Al), aluminum alloys (AlNd), chromium (Cr), tungsten (W), molybdenum (Mo), and copper (Cu).

17. The device according to claim 1, wherein each of the switching elements and the driving elements include an active layer, a gate electrode, a source electrode, and a drain electrode.

18. A method of fabricating an organic electroluminescent display (ELD) device, comprising steps of:
   forming a plurality of switching elements and a plurality of driving elements interconnected on a first substrate;
   forming a plurality of connecting electrodes interconnected to each of the driving elements;
   forming a plurality of subsidiary electrodes within spaces between two adjacent pixel regions of a second substrate;
   forming a first electrode on an inner surface of the second substrate covering the plurality of subsidiary electrodes;
   forming an organic light-emitting layer on the first electrode;
   forming first portions of a second electrode on the organic light-emitting layer; and
   bonding the first and second substrates so that the connecting electrode of the first substrate contacts the second electrode.

19. The method according to claim 18, wherein the subsidiary electrodes form a lattice shape.

20. The method according to claim 18, further comprising a step of forming a plurality of partitions having first end portions of a first width and second end portions of a second width.

21. The method according to claim 20, wherein each of the first end portions are formed on the first electrode in alignment with each of the subsidiary electrodes.

22. The method according to claim 20, wherein the second width is larger than the first width.

23. The method according to claim 22, further comprising a step of forming second portions of the second electrode on the second end portions of the partitions.

24. The method according to claim 23, wherein the second end portions are aligned with the driving elements.

25. The method according to claim 18, wherein the subsidiary electrode includes one of aluminum (Al), chromium (Cr), and molybdenum (Mo).

26. The method according to claim 25, wherein an electrical resistance of the subsidiary electrode is lower than an electrical resistance of the first electrode.

27. The method according to claim 18, wherein the first electrode functions as an anode electrode to input holes into the organic light-emitting layer, and the second electrode functions as a cathode electrode to input electrons into the organic light-emitting layer.

28. The method according to claim 27, wherein the first electrode includes indium-tin-oxide (ITO).

29. The method according to claim 27, wherein the second electrode includes one of calcium (Ca), aluminum (Al), and magnesium (Mg).

30. The method according to claim 18, wherein the connecting electrode includes one of calcium (Ca), aluminum (Al) and magnesium (Mg).

31. The method according to claim 18, wherein the organic light-emitting layer includes a hole-carrying layer adjacent to the first electrode and an electron-carrying layer adjacent to the first portions of the second electrode.

32. The method according to claim 18, wherein the subsidiary electrode includes a conductive metal material having an electrical resistance lower than an electrical resistance of the first electrode.

33. The method according to claim 18, wherein the subsidiary electrode includes one of aluminum (Al), aluminum alloys (AlNd), chromium (Cr), tungsten (W), molybdenum (Mo), and copper (Cu).

34. The method according to claim 18, wherein each of the switching elements and the driving elements include an active layer, a gate electrode, a source electrode, and a drain electrode.

35. An organic electroluminescent display (ELD) device, comprising:

a first substrate;

a second substrate spaced apart and facing the first substrate;

a plurality of switching elements and a plurality of driving elements interconnected on the first substrate;

a plurality of connecting electrodes connected to each of the driving elements;

a first electrode formed on an inner surface of the second substrate;

a plurality of subsidiary electrodes formed on the first electrode within spaces between two adjacent pixel regions;

a plurality of partitions having first end portions of a first width disposed on the subsidiary electrodes and the first electrode and second end portions of a second width larger than the first width;

a plurality of organic light-emitting layers disposed on the first electrode between the plurality of partitions; and a second electrode disposed on the organic light-emitting layers and the second end portions of the plurality of partitions.

* * * * *